(12) United States Patent
Yonenaga et al.

(10) Patent No.: US 9,750,087 B2
(45) Date of Patent: Aug. 29, 2017

(54) HEAT TREATMENT APPARATUS

(71) Applicant: TOKYO ELECTRON LIMITED, Tokyo (JP)

(72) Inventors: Tomihiro Yonenaga, Nirasaki (JP); Yumiko Kawano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/664,948

(22) Filed: Mar. 23, 2015

(65) Prior Publication Data
US 2015/0201468 A1 Jul. 16, 2015

Related U.S. Application Data

(63) Continuation of application No. PCT/JP2013/071918, filed on Aug. 14, 2013.

(30) Foreign Application Priority Data

Sep. 27, 2012 (JP) .................................. 2012-214304

(51) Int. Cl.
*H05B 6/10* (2006.01)
*H05B 6/00* (2006.01)
*H01L 21/67* (2006.01)

(52) U.S. Cl.
CPC ....... *H05B 6/105* (2013.01); *H01L 21/67103* (2013.01); *H01L 21/67115* (2013.01); *Y10T 29/49826* (2015.01); *Y10T 156/10* (2015.01)

(58) Field of Classification Search
CPC ......... B29C 65/36; B29C 35/08; B29C 65/32; H05B 6/105; C30B 25/12; C09J 5/06;
(Continued)

(56) References Cited

U.S. PATENT DOCUMENTS 4,224,494 A * 9/1980 Reboux ................. A47J 27/002
219/615
4,386,255 A 5/1983 Berkman
(Continued)

FOREIGN PATENT DOCUMENTS

JP S59-1199 A 1/1984
JP 60-113370 U 7/1985
(Continued)

OTHER PUBLICATIONS

International Search Report dated Sep. 17, 2013 corresponding to application No. PCT/JP2013/071918.

Primary Examiner — David Angwin
Assistant Examiner — Gyounghyun Bae
(74) Attorney, Agent, or Firm — Nath, Goldberg & Meyer; Jerald L. Meyer

(57) ABSTRACT

A heat treatment apparatus configured to perform a heat treatment on a plurality of substrates, including: a processing vessel configured to accommodate the plurality of substrates on which the heat treatment is performed; an electromagnetic induction source configured to generate an oscillating magnetic field having a high frequency within the processing vessel; and a substrate holding element having a plurality of heating elements arranged in a vertical direction and spacers interposed between the adjacent heating elements, the heating element being made of a conductive material and allowing an induced current caused by the oscillating magnetic field to flow therein to generate heat, the substrate holding element supporting the substrates in a state where the substrates are mounted on the heating elements.

10 Claims, 8 Drawing Sheets

(58) Field of Classification Search
CPC ......... H01L 21/67115; H01L 21/67103; Y10T 29/49826; Y10T 156/10
USPC .............................................. 156/60; 29/428
See application file for complete search history.

(56) References Cited

U.S. PATENT DOCUMENTS

| | | | | |
|---|---|---|---|---|
| 6,932,872 | B2* | 8/2005 | Hamaguchi | H05B 6/108 118/725 |
| 7,582,491 | B2* | 9/2009 | Sasaki | H01L 21/67248 438/14 |
| 8,226,769 | B2* | 7/2012 | Matyushkin | H01L 21/67109 118/725 |
| 8,354,623 | B2* | 1/2013 | Matsuura | C23C 16/4581 118/725 |
| 9,275,837 | B2* | 3/2016 | Yamazawa | H01J 37/32091 |
| 2005/0042881 | A1* | 2/2005 | Nishimoto | H01L 21/6833 438/710 |
| 2006/0213906 | A1* | 9/2006 | Buchala | B65D 81/3446 219/730 |
| 2006/0231549 | A1* | 10/2006 | Kisner | H05B 6/101 219/635 |
| 2008/0118412 | A1* | 5/2008 | Okura | C23C 30/00 422/186.21 |
| 2008/0197780 | A1* | 8/2008 | Yamazawa | H01J 37/32091 315/111.21 |
| 2009/0184109 | A1* | 7/2009 | Sawada | H01L 21/67109 219/643 |
| 2009/0261090 | A1* | 10/2009 | Delperier | C23C 16/452 219/634 |
| 2011/0210117 | A1* | 9/2011 | Yonenaga | C23C 16/46 219/634 |
| 2011/0248024 | A1* | 10/2011 | Yonenaga | H01L 21/67109 219/634 |
| 2012/0138599 | A1* | 6/2012 | Miyata | H01L 21/67109 219/634 |
| 2012/0270169 | A1* | 10/2012 | Yamaga | H01L 21/67248 432/49 |
| 2013/0140298 | A1* | 6/2013 | Uchida | H01L 21/67109 219/634 |
| 2013/0264335 | A1* | 10/2013 | Uchida | H05B 6/36 219/634 |

FOREIGN PATENT DOCUMENTS

| | | |
|---|---|---|
| JP | 03022523 A | 1/1991 |
| JP | 09330884 A | 12/1997 |
| JP | 2009141205 A | 6/2009 |
| JP | 2010059490 A | 3/2010 |
| JP | 2010103280 A | 5/2010 |
| JP | 2011077065 A | 4/2011 |
| KR | 1020100116204 A | 10/2010 |

* cited by examiner

HEAT TREATMENT APPARATUS

CROSS-REFERENCE TO RELATED APPLICATION

This application is a Continuation Application of PCT International Application No. PCT/JP2013/071918, filed on Aug. 14, 2013, which claimed the benefit of priority from Japanese Patent Application No. 2012-214304 filed on Sep. 27, 2012, the entire disclosures of which are incorporated herein by reference.

TECHNICAL FIELD

The present disclosure relates to a heat treatment apparatus for performing a heat treatment on a plurality of substrates.

BACKGROUND

As a technique of heating substrates such as semiconductor substrates or flat panel display (FPD) substrates, a technique has been known in which an oscillating magnetic field having a high frequency is generated through an induction coil supplied with a high frequency power and heating elements disposed within the oscillating magnetic field generate heat through an induced current (electromagnetic induction heating), thereby heating the substrates mounted on or close to the heating elements by the heat transferred from the heating elements. In order to apply this technique to a batch processing of a plurality of sheets of substrates, a heat treatment apparatus is proposed in which a plurality of heating elements are vertically disposed in the shape of a shelf within a vacuumized processing vessel and the plurality of heating elements generate heat through the induction coil installed outside the vacuum processing vessel, thereby heating the plurality of sheets of substrates correspondingly disposed with respect to the plurality of heating elements.

For example, it has been known that a vertical film forming apparatus, as a type of heat treatment apparatus, which heats a plurality sheets of substrates using electromagnetic induction heating and supplies each substrate with a source gas to form a film on the surface of the substrate. This film forming apparatus is provided with a support jig which is made of a conductive material and supports the plurality of sheets of substrates within a processing vessel. The support jig is configured to function as a heating element in the electromagnetic induction heating, thus generating a vertical oscillating magnetic field in the processing vessel by an induction coil provided outside the processing vessel and making the support jig generate heat. Then, the supported substrates within the processing vessel are heated. Further, a film forming process is performed by allowing the source gas to flow parallel to the substrates from a gas introduction port disposed at a side of the processing vessel.

However, in such a configuration, the support jig for supporting the substrates is enlarged as the substrates have an enlarged diameter. Thus, it is difficult for the support jig to generate heat uniformly through the induction coil provided outside the processing vessel. Further, it is also difficult to satisfactorily maintain in-plane or inter-plane temperature uniformity of the substrates heated by the heat transferred from the support jig. In addition, films or reaction products attached on the support jig in the film forming process are eventually peeled off and thus become a dust generating source. Thus, a cleaning process, in which the support jig is detached from the processing vessel and accretions attached on the support jig are removed, is periodically needed. However, the support jig is enlarged in this configuration as the substrates have an enlarged diameter. Therefore, it is difficult to detach and attach the support jig from and to the processing vessel and the cost of cleaning solutions and the like is increased in cleaning the support jig.

In comparison, although another type of heat treatment apparatus is a vertical film forming apparatus, a plurality of heating elements corresponding to respective substrates are provided, contrary to the integrated heating element configured to generate heat through the induction coil provided outside the processing vessel. Further, the plurality of heating elements is configured to be supported by a support jig made of an insulating material such as quartz or the like. Since an induced current does not flow in the support jig made of an insulating material and thus the support jig does not generate heat, a few films or reaction products are attached. In addition, the heating elements are separated corresponding to the respective substrates. Thus, it is convenient to attach and detach the heating elements to and from the support jig and to clean the heating elements. The substrates are respectively heated by the heat transferred from the corresponding heating elements, and so it is possible to adjust an in-plane temperature distribution of the substrates by changing the shape of the heating elements or a distance between the heating elements and the substrates. Further, in such a configuration, since the support jig rotates with the heating elements supported therein, it is possible to obtain in-plane temperature uniformity of a large diameter substrate.

In addition, as a technique in which the heating elements corresponding to respective substrates are detachably installed to the support jig and the support jig is configured to be rotatable, it has been known that an electromagnet supplied with high frequency power, as a mechanism for generating a horizontal oscillating magnetic field, is disposed outside a processing vessel. Also, it has been known that an induction coil is disposed inside a processing vessel to be closer to the heating elements, thereby improving the efficiency of electromagnetic induction heating.

However, in the techniques as described above, the support jig for supporting and rotating the heating elements needs a strong structure for holding and supporting the plurality of heating elements. For this reason, since the support jig occupies a large space within the processing vessel, the heating elements are spaced apart from the induction coil by the occupied space. In the electromagnetic induction heating, the heating efficiency depends on a distance between the induction coil and the heating elements. Thus, it is possible to increase the heating efficiency by causing the heating elements to get closer to the induction coil. However, in this technique, since it is necessary to space the heating elements and the induction coil apart from each other by the occupied space of the support jig, it is difficult to increase the heating efficiency.

Furthermore, the support jig is made of an insulating material and the support jig itself does not generate heat. However, since the support jig receives heat from the heating elements to have increased temperature, although less than the case of the heating elements, films or reaction products are attached to the support jig in the film forming process and may become a dust generating source. For this reason, it is also necessary to periodically perform a cleaning process on the support jig. Accordingly, the above-described problems still remain making it 1 difficult to detach and attach the support jig from and to the processing vessel thereby increasing the cost of cleaning the support jig.

SUMMARY

The present disclosure provides some embodiments of a heat treatment apparatus, in which a support jig for supporting heating elements is omitted from the interior of a processing vessel to allow the heating element to be close to the induction coil, thereby remarkably increasing the heating efficiency and minimizing maintenance activities or costs for preventing the generation of dust within the processing vessel.

According to one embodiment of the present disclosure, there is provided a heat treatment apparatus configured to perform a heat treatment on a plurality of substrates, including: a processing vessel configured to accommodate the plurality of substrates on which the heat treatment is performed; an electromagnetic induction source configured to generate an oscillating magnetic field having a high frequency within the processing vessel; and a substrate holding element having a plurality of heating elements arranged in a vertical direction and spacers interposed between the adjacent heating elements, the heating element being made of a conductive material and allowing an induced current caused by the oscillating magnetic field to flow therein to generate heat, the substrate holding element supporting the substrates in a state where the substrates are mounted on the heating elements.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will now be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, a first embodiment of the present disclosure will be described. Here is illustrated an example of a heat treatment apparatus in which a spiral induction coil as an electromagnetic induction source is provided outside a processing vessel and an oscillating magnetic field in the vertical direction is generated within the processing vessel.

Figure 1:
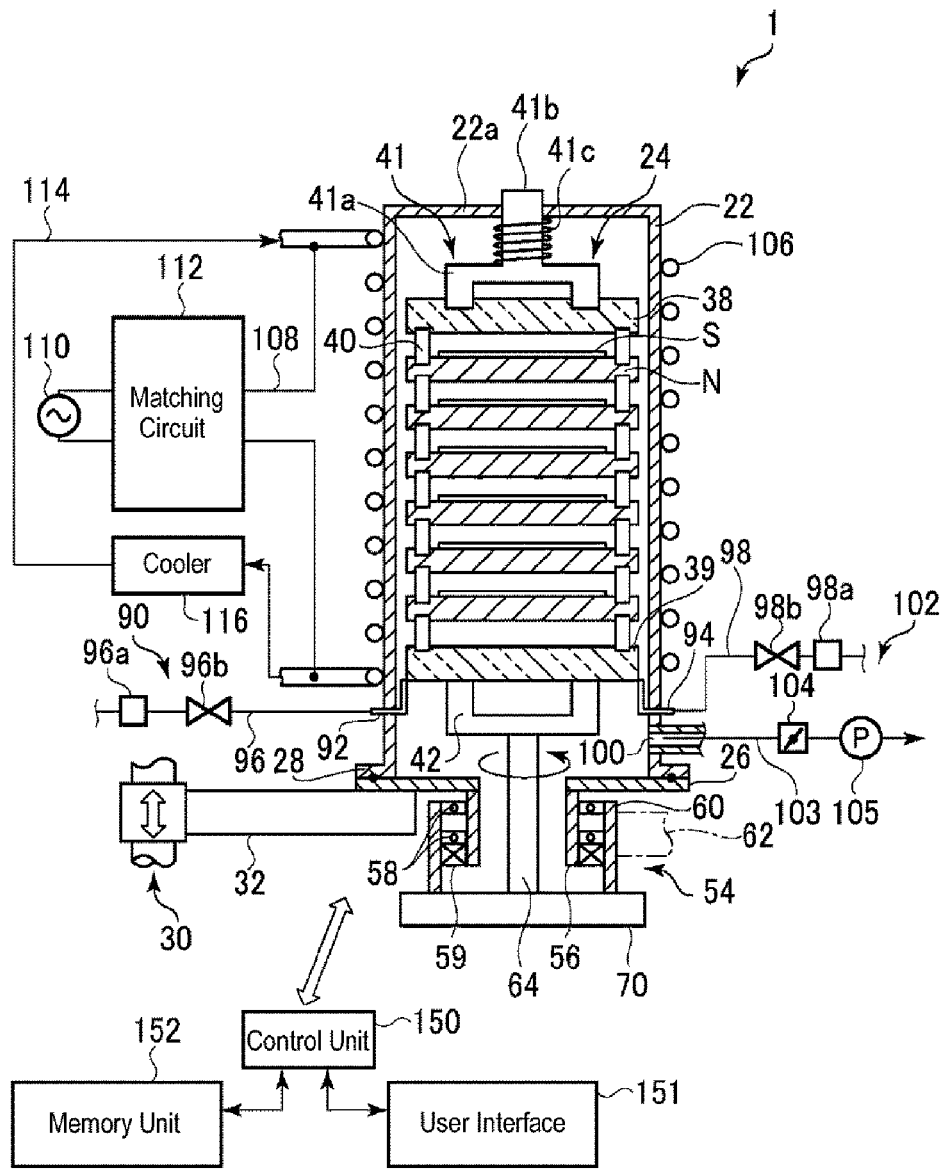
FIG. 1 is a longitudinal cross sectional view showing a heat treatment apparatus according to a first embodiment of the present disclosure.

FIG. 1 is a longitudinal cross sectional view showing the heat treatment apparatus according to the first embodiment of the present disclosure. As shown in FIG. 1, a heat treatment apparatus 1 includes a circular cylindrical vertical processing vessel 22 having an open lower end and a closed upper end. The processing vessel 22 is made of an insulating material, for example, quartz, having thermal resistance and allowing a magnetic flux caused by an oscillating magnetic field to pass through the insulating material.

In the processing vessel 22, a substrate holding element 24, in which a plurality of heating elements N are vertically disposed at a predetermined pitch from the lower portion of the processing vessel 22 and substrates S are supported in a state where the substrates S are mounted on the respective heating elements N, is insertably provided. Each substrate S is mainly heated by the heating element N which is directly under the substrate S. When the substrate holding element 24 is inserted, the opening of the lower end of the processing vessel 22 is closed and sealed by a lid part 26 made of, for example, a quartz or stainless plate. A seal member 28, such as an O-ring, is interposed between the lower end of the processing vessel 22 and the lid part 26 in order to maintain airtightness. The lid part 26 and the substrate holding element 24 as a whole are supported at a leading end of an arm 32 installed to a lift unit 30 such as a boat elevator. With this configuration, the substrate holding element 24 and the lid part 26 may be lifted up or down together.

The substrate holding element 24 is configured to be rotatable by a rotating unit 54 installed to the lid part 26 at the lower end of the processing vessel 22. Specifically, the rotating unit 54 has a circular cylindrical fixed sleeve 56 extending downward from the central portion of the lid part 26. Further, the interior of the fixed sleeve 56 is in communication with the interior of the processing vessel 22. A circular cylindrical rotating member 60 is rotatably installed on the outer periphery of the fixed sleeve 56 through a bearing 58. In addition, a driving belt 62 which is driven by a driving source (not shown) is wound around the rotating member 60, thereby rotating the rotating member 60 while driving the driving belt 62.

In addition, a magnetic fluid seal 59 is installed under the bearing 58 between the fixed sleeve 56 and the rotating member 60. Thus, although the rotating member 60 is rotated, the airtightness of the processing vessel 22 is maintained.

A rotating shaft 64 extending downward from the substrate holding element 24 is inserted into the fixed sleeve 56.

The rotating member 60 and the rotating shaft 64 are fixed to a base plate 70. As the rotating member 60 is rotated through the driving belt 62 by the driving source (not shown), the substrate holding element 24 is rotated through the rotating shaft 64.

A lower portion of the processing vessel 22 is provided with a gas supply mechanism 90 configured to supply gas such as a source gas necessary for a film forming process within the processing vessel 22. The gas supply mechanism 90 includes a first gas nozzle 92 and a second gas nozzle 94 made of, for example, quartz, which penetrate a sidewall of the processing vessel 22 from the outside thereof and reach the interior of the processing vessel 22. The first gas nozzle 92 and the second gas nozzle 94 are connected to a gas supply pipe 96 and a gas supply pipe 98, respectively, to which opening/closing valves 96b and 98b and flow rate controllers 96a and 98a such as mass flow controllers are installed in order, respectively. With this configuration, a first gas and a second gas necessary for a film forming process may be introduced while their flow rates are controlled, respectively. As examples of a film forming process, CVD such as $SiO_2$, SiN, TiN, Ru or the like, and epitaxial growth of Ge, GaN or the like are illustrated.

An exhaust port 100 is installed at a lower portion of the sidewall of the processing vessel 22. The exhaust port 100 is provided with an exhaust mechanism 102 configured to exhaust the interior of the processing vessel 22. The exhaust mechanism 102 includes an exhaust pipe 103 connected to the exhaust port 100, a pressure control valve 104 provided on the exhaust pipe 103, and an exhaust pump 105 connected to the exhaust pipe 103 and configured to exhaust the interior of the processing vessel 22 through the exhaust pipe 103.

An induction coil 106, as an electromagnetic induction source, is provided outside the processing vessel 22. The induction coil 106 is configured by winding a metallic pipe around the outer periphery of the processing vessel 22 along its vertical direction in a spiral shape, wherein its winding area in the vertical direction is larger than an area for accommodating the substrate S.

The induction coil 106 may be configured by winding the metallic pipe with a gap or by closely winding the metallic pipe with no gap. The metallic pipe of the induction coil 106 may be appropriately made of copper.

In addition, feeding lines 108 extending from a high frequency power supply 110 are connected to both upper and lower ends of the induction coil 106, and a high frequency power is applied to the induction coil 106 from the high frequency power supply 110. A matching circuit 112 for impedance matching is installed in the middle of the feeding lines 108.

Figure 2:
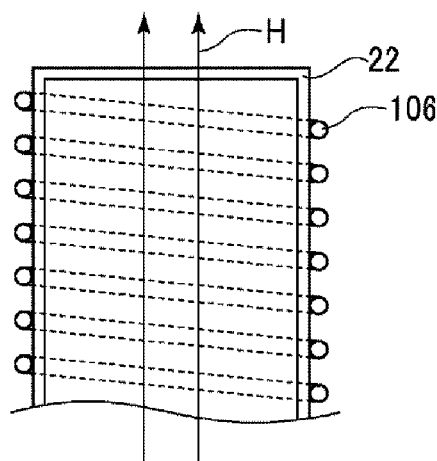
FIG. 2 is a view illustrating a vertical oscillating magnetic field generated in a processing vessel of the heat treatment apparatus according to the first embodiment of the present disclosure.

By applying a high frequency power to the induction coil 106, as shown in FIG. 2, an oscillating magnetic field H in the vertical direction is generated within the processing vessel 22. Further, the oscillating magnetic field H causes an induced current to flow in the heating elements N constituting the substrate holding element 24, whereby the heating elements N generate heat. A frequency of the high frequency power applied to the induction coil 106 is set to fall within a range of, for example, 1 to 100 kHz, or specifically, 10 to 50 kHz.

In addition, a coolant channel 114 is connected to both ends of the metallic pipe constituting the induction coil 106 and a cooler 116 is connected to the coolant channel 114. Thus, a coolant is allowed to flow into the metallic pipe constituting the induction coil 106 from the cooler 116 through the coolant channel 114 in order to cool the induction coil 106. The coolant may include, for example, cooling water.

Each component of the heat treatment apparatus 1 is controlled by a control unit 150 provided with a microprocessor (computer). A user interface 151, which includes a keyboard for input operation such as command inputs for an operator to control the heat treatment apparatus 1, a display for visualizing and displaying the operational status of the heat treatment apparatus 1, and the like, is connected to the control unit 150. In addition, the control unit 150 is connected to a memory unit 152, which stores a control program for implementing various kinds of processing performed in the heat treatment apparatus 1 by controlling the control unit 150, or stores a program for performing the processing for the respective components of the heat treatment apparatus according to processing conditions, i.e., a processing recipe. The processing recipe is stored in a storage medium of the memory unit 152. The storage medium may be a portable memory, such as a CD-ROM, DVD, or flash memory, as well as a hard disk or semiconductor memory embedded in a computer. In addition, the processing recipe may be suitably transmitted from other units, for example, through a dedicated line. In addition, any processing recipe, if necessary, is invoked from the memory unit 152 by instructions or the like from the user interface 151 and is performed by the control unit 150. Accordingly, a desired processing is performed in the heat treatment apparatus 1 through the control of the control unit 150.

Then, the substrate holding element 24 will be described in detail.

The substrate holding element 24 is configured such that a shelf-shaped structure, in which the plurality of horizontal heating elements N are arranged in the vertical direction, the insulation members 38 and 39 are respectively disposed on top and bottom of the heating elements N, and spacers 40 are interposed between the heating elements N and between the heating elements N and the insulation members 38 and 39, is interposed between a pressurizing member 41 disposed on top of the shelf-shaped structure and a support member 42 disposed on the bottom thereof.

The pressurizing member 41 has a main body 41a, a shaft member 41b extending upward from the center of the main body 41a and being rotatably supported at the center of a ceiling wall 22a of the processing vessel 22, and a coil spring 41c wound around the shaft member 41b to pressurize the main body 41a downward, thereby pressing the upper insulation member 38 through the pressurizing force of the coil spring 41c. The shaft member 41b is detachably installed to the ceiling wall 22a of the processing vessel 22 and air-tightly and rotatably mounted to the ceiling wall 22a.

The support member 42 supports the lower insulation member 39 and has the rotating shaft 64 fixed to the center of the lower surface of the support member 42. Therefore, as the rotating member 60 rotates and the rotating shaft 64 is then rotated, the substrate holding element 24 is also rotated. That is, the substrate holding element 24 constitutes a self-reliant rotary structure in which the heating elements N and the spacers 40 are combined without using substrate support jigs.

The heating element N is formed in the shape of a circular disk having a mounting surface of the substrate S. The heating element N is made of a conductive material having an appropriate specific resistance, in which the oscillating magnetic field H causes the induced current to flow and thus a large amount of Joule heat can be generated. In addition, in some embodiments, the material constituting the heating element N has a high thermal conductivity. By increasing the thermal conductivity, a heat distribution of the heating element N becomes smooth and thermal uniformity is improved. Such a material includes, for example, carbon-based materials such as graphite, carbon composite, or silicon carbide (SiC), which may be appropriately used for the heating element.

Figure 3:
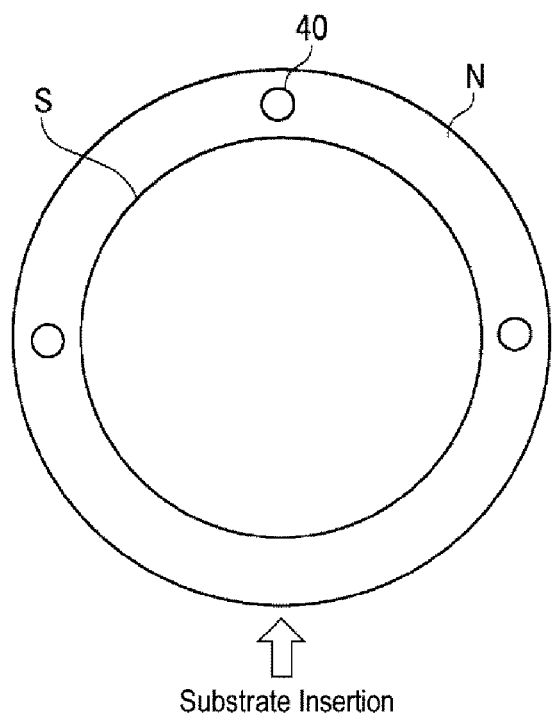
FIG. 3 is a view illustrating an arrangement of a heating element and spacers in a substrate holding element.

Three spacers 40, for example, are installed in the outer periphery of the circular disk-shaped heating element N, as shown in FIG. 3. The intervals between the three spacers 40 are adjusted such that the substrate S can be inserted in the arrow direction. The spacers 40 are configured to be fitted into grooves formed in the heating elements N and the upper and lower insulation members 38 and 39, as shown in FIG. 1.

Figure 4A:
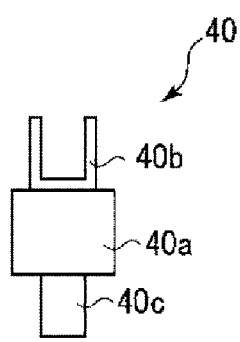
FIG. 4A is a view showing a shape of the spacer used when the heating element is thin.
Figure 4B:
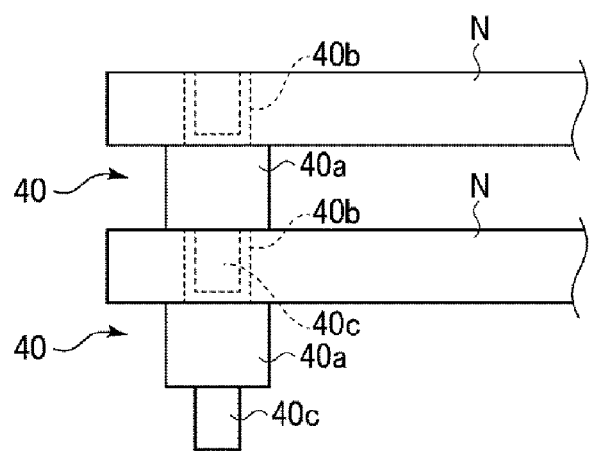
FIG. 4B is a view showing a coupled state of the spacers shown in FIG. 4A.

When the heating element N has a small thickness, it is difficult to couple the heating element N and the spacer 40 with each other. However, in this case, for example, as shown in FIG. 4A, a spacer having a concave portion 40b and a convex portion 40c respectively provided in top and bottom of a main body 40a may be used. Further, as shown in FIG. 4B, the concave portion 40b and the convex portion 40c of the spacers 40 may be coupled within the heating element N.

If the spacer 40 itself generates heat by electromagnetic induction heating and has a high temperature, then the connection with the heating element N becomes a hot spot. Thus, the thermal uniformity of the heating element N may be deteriorated in some cases. In order to prevent this, in some embodiments, the spacer 40 is selected to have a material or shape making it difficult to generate heat. If a material constituting the spacer 40 is an insulating material such as quartz or alumina, then, since the induced current does not flow in the spacer 40, the spacer 40 itself does not generate heat and no hot spot is generated regardless of the shape.

In addition, even if the spacer 40 may be formed of the same material as the heating element N, the heat generation of the spacer 40 can be suppressed by causing the spacer 40 to have a small area where a magnetic flux caused by the oscillating magnetic field H is interlinked. For example, if the spacer 40 has a hollow shape such as a circular cylinder, since an interlinkage area of the magnetic flux caused by the vertical oscillating magnetic field H generated by the spiral induction coil 106 is decreased and an induced electromotive force is reduced as much, the heat generation of the spacer 40 can be suppressed. In this case, the shape of the spacer 40 is not limited to a circular cylindrical shape, but may be a polygonal cylindrical shape having a polygonal cross-section.

In addition, if the spacer 40 has a column shape having a cross section of a cross or reference symbol (·X·), then, since the interlinkage area of the magnetic flux can be made small, the heat generation of the spacer 40 can be further suppressed.

Figure 5:
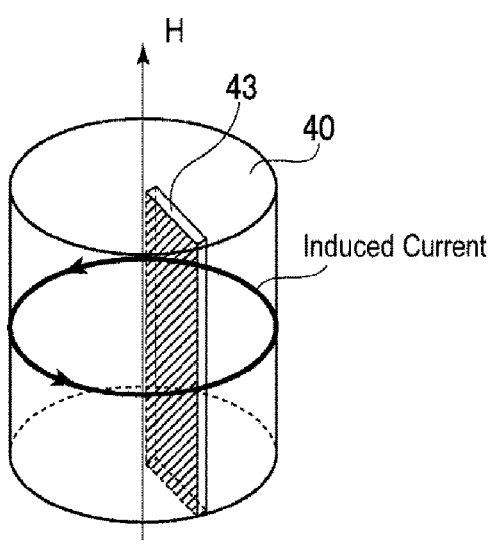
FIG. 5 is a view showing an example of an induced current flowing on the circular cylindrical spacer placed in a vertical oscillating magnetic field and a longitudinal slit traversing the path of the induced current.

Further, even if the spacer 40 does not have a hollow shape as described above but, for example, a solid circular cylindrical shape, the vertical oscillating magnetic field H causes the induced current to flow such that it goes around the side surface of the cylinder, as shown in FIG. 5. Thus, as a longitudinal slit 43 traversing the path of the induced current is formed at the side surface of the cylinder to make it difficult for the induced current to flow, the heat generation of the spacer 40 itself can be suppressed. In such a case, the shape of the spacer 40 is not limited to a circular cylindrical shape but may be a polygonal cylindrical shape having a polygonal cross-section.

The heating element N is formed with a groove (not shown), into which a fork not shown can be inserted such that the substrate S can be transferred by the fork. Instead of forming the groove, substrate lifting pins, which can protrude and retract from the substrate mounting surface of the heating element N, may be installed.

In the electromagnetic induction heating, depending on the distance between the induction coil and the heating elements, the heating efficiency can be improved by causing the heating elements to get closer to the induction coil. However, if the plurality of heating elements are supported by the support jig, since the support jig occupies a large space within the processing vessel and the heating elements cannot be close to the induction coil, it is difficult to improve the heating efficiency. In addition, a support jig made of an insulating material does not generate heat and also has a large thermal coupling with the supported heating elements. Thus, in such a configuration, a substantive thermal capacity becomes drastically increased. For this reason, a temperature rising rate of the heating elements was not sufficiently increased, it was impossible to raise the temperature of the substrates at a high rate. In addition, when performing the film forming process, since films or reaction products are also attached to the support jig and may become a dust generating source eventually, it is necessary to periodically perform a cleaning process on the support jig to remove accretions. Therefore, when large diameter substrates are held and supported, since the support jig becomes large, it is difficult to insert and detach the support jig into and from the processing vessel and the cost of cleaning solutions and the like is increased in cleaning the support jig.

In comparison, according to this embodiment, without using the support jig, the plurality of heating elements N and the spacers 40 are assembled and combined into the form of blocks, thereby constituting the substrate holding element 24. For this reason, since the support jig occupying space becomes unnecessary and the heating element N can be closer to the induction coil 106, it is possible to remarkably improve the heating efficiency. Further, the thermal capacity of the spacers 40 may be mostly negligible relative to the thermal capacity of the heating element N. Thus, the substantive thermal capacity of the substrate holding element 24 can be minimized in this configuration. For this reason, it is possible to sufficiently increase a temperature rising rate of the heating elements N and thus to raise the temperature of the substrates S at a high speed.

In addition, the heating elements N and the spacers 40 are combined without using the support jig and only the insulation members 38 and 39, the pressurizing member 41, and the support member 42 are additionally needed. Therefore, it is easy to disassemble and assemble them, and a cleaning process can be easily performed in a state where they are disassembled. For this reason, it is possible to remarkably reduce the accompanying work and cost with the maintenance for suppressing dust generation within the processing vessel.

In the meantime, according to the enlarged diameter of a substrate, the size of the processing vessel is increased, the occupying area (footprint) is remarkably increased in a heat treatment apparatus having a plurality of processing vessels affiliated (multi-chamber). Thus, the operating cost of the apparatus is increased. Further, in the vertical heat treatment apparatus in which plural sheets of substrates are processed at a time, if the size of the processing vessel is increased, it may be difficult to be carried or installed in a building in some cases.

In comparison, in this embodiment, the horizontal size of the processing vessel 22 can be reduced as much as a support jig is used. Thus, the footprint of the heat treatment apparatus can be reduced. Further, by reducing the intervals between the heating elements N in the vertical direction, the size of the processing vessel 22 can be reduced without reducing the number of substrates to be processed at a time. However, in case of the film forming process, since the substrates S are loaded and it is also necessary to secure conductance sufficient to supply gas such as a source gas to the substrates S, there is a limitation in the reduction of the intervals between the heating elements N. Accordingly, it is effective to reduce the thickness of the heating element N itself. When the heating element N is thin, the coupling of the heating element N and the spacer 40 is difficult. However, in this case, as shown in FIG. 4B, the substrate holding element 24 may be configured such that the spacers 40 are coupled to each other within the heating element N, for example.

In this way, according to this embodiment, the horizontal or vertical size of the processing vessel can be reduced and the heat treatment apparatus with this processing vessel can be miniaturized, thereby reducing the maintenance and installation costs of the apparatus.

Second Embodiment

Subsequently, a second embodiment will be described. Here, an example of a heat treatment apparatus, in which a plurality of electromagnets as an electromagnetic induction source is installed outside a processing vessel and an oscillating magnetic field in the horizontal direction is generated within the processing vessel, will be described.

Even in this embodiment, a plurality of heating elements and spacers are assembled and combined into the form of blocks using no support jig to constitute a substrate holding element in the same manner as the first embodiment, and the plurality of heating elements are disposed in the vertical direction within the processing vessel.

Figure 6:
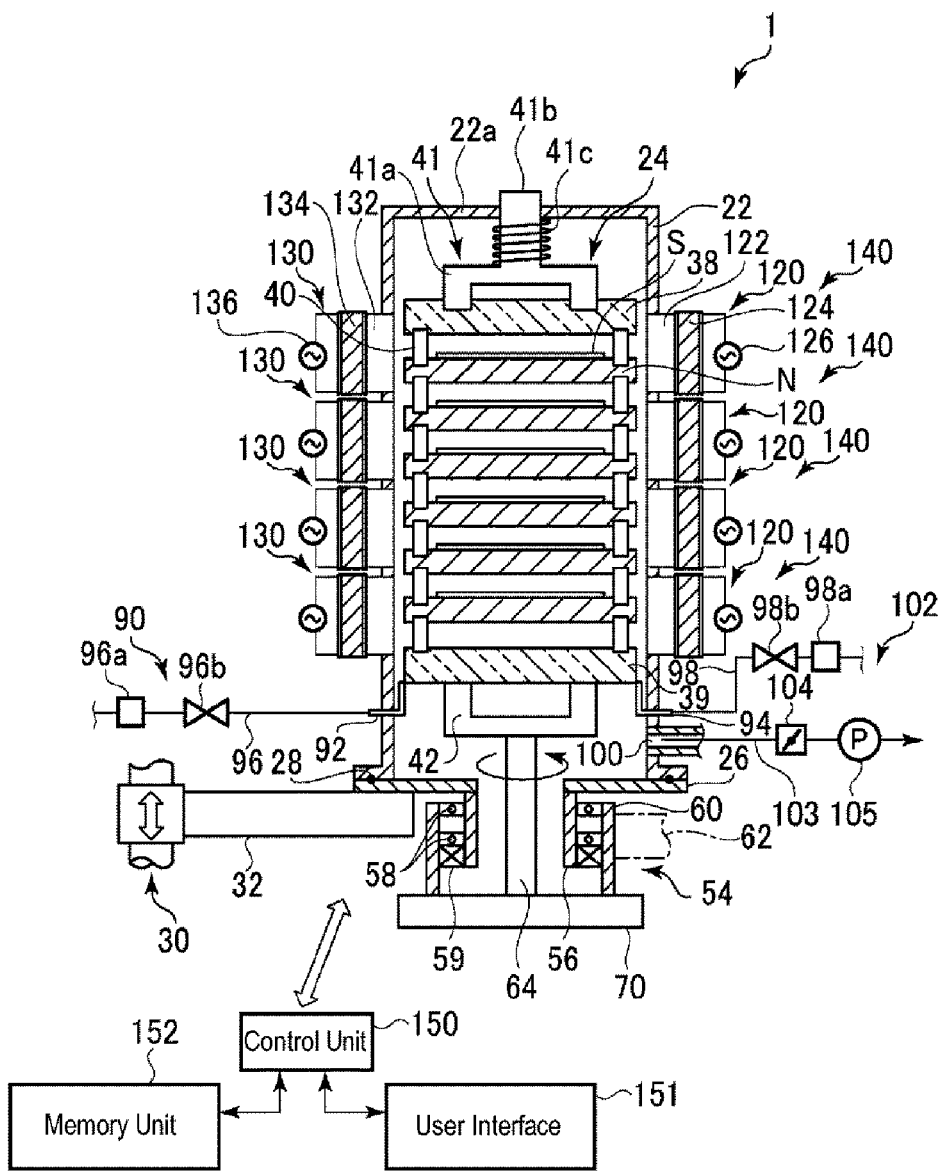
FIG. 6 is a longitudinal cross sectional view showing a heat treatment apparatus according to a second embodiment of the present disclosure.

FIG. 6 is a longitudinal cross sectional view showing a heat treatment apparatus according to the second embodiment of the present disclosure. In FIG. 6, only the configuration of the electromagnetic induction source is different from that of FIG. 1. Thus, the same reference numerals are assigned to the same elements as those of FIG. 1 and the description thereof will be omitted.

In this embodiment, a processing vessel 22 has a polygonal cylindrical shape. A plurality of electromagnetic induction sources 140, each of which consists of a pair of electromagnets 120 and 130 respectively installed at opposite sidewalls of the processing vessel 22, are installed along the vertical direction of the processing vessel 22. This embodiment shows an example having four electromagnetic induction sources.

The electromagnets 120 and 130 constituting each electromagnetic induction source 140 are configured to include U-shaped magnetic cores 122 and 132 each having two magnetic poles and induction coils 124 and 134 wound around the magnetic cores 122 and 132, respectively. A high frequency power is applied to the induction coils 124 and 134 from high frequency power supplies 126 and 136, respectively.

Figure 7:
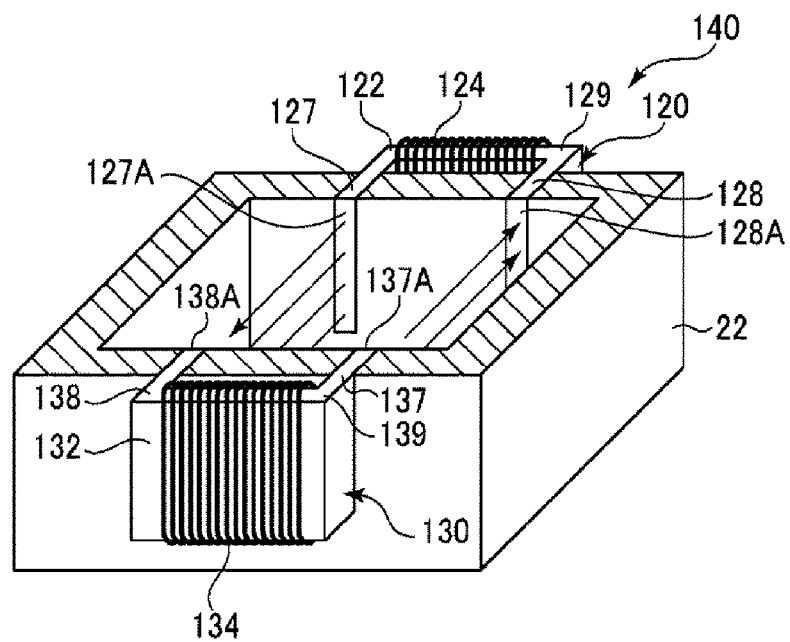
FIG. 7 is a perspective view showing an electromagnetic induction source used in the heat treatment apparatus according to the second embodiment of the present disclosure.

Specifically, as shown in FIG. 7, the magnetic core 122 of the electromagnet 120 has two magnetic poles 127 and 128 connected by an intermediate portion 129, which are configured integrally with each other, wherein the induction coil 124 is wound around the intermediate portion 129. In the meantime, the magnetic core 132 of the electromagnet 130 has two magnetic poles 137 and 138 connected by an intermediate portion 139, which are configured integrally with each other, wherein the induction coil 134 is wound around the intermediate portion 139. The magnetic poles 127 and 128 of the electromagnet 120 and the magnetic poles 137 and 138 of the electromagnet 130 are inserted and mounted into holes formed at the processing vessel 22. Two magnetic pole surfaces (end surfaces of the magnetic poles 127 and 128) 127A and 128A of the electromagnet 120 and two magnetic pole surfaces (end surfaces of the magnetic poles 138 and 137) 138A and 137A of the electromagnet 130 are disposed to face each other. In some embodiments, each of the magnetic cores 122 and 132 is made of a ferritic material or a powder magnetic core material in order to suppress iron loss.

Each of the magnetic pole surfaces 127A, 128A, 137A and 138A may be exposed to the interior of the processing vessel 22 from openings formed in the sidewall of the processing vessel 22, as shown in FIG. 7. However, a window (not shown) made of an insulating material such as quartz or alumina may be also formed in each opening, and a magnetic flux from each magnetic pole surface 127A, 128A, 137A or 138A disposed outside the window may be transmitted therethrough into the interior of the processing vessel 22.

In such a state, by applying a high frequency power to the induction coils 124 and 134 from the high frequency power supplies 126 and 136, the horizontal oscillating magnetic field is generated within the processing vessel 22.

Further, the plurality of electromagnetic induction sources 140 each consisting of the electromagnets 120 and 130 are installed along the vertical direction of the processing vessel 22. Thus, the respective heat generation amounts of the heating elements N corresponding to the respective electromagnetic induction sources 140 can be individually controlled by individually controlling high frequency current levels supplied to the induction coils 124 and 134 of the electromagnets 120 and 130 in the respective electromagnetic induction sources 140. For this reason, a distribution of the heat generation amount between the heating elements N vertically disposed can be adjusted, thereby satisfactorily maintaining inter-plane temperature uniformity of the substrates S.

Figure 8:
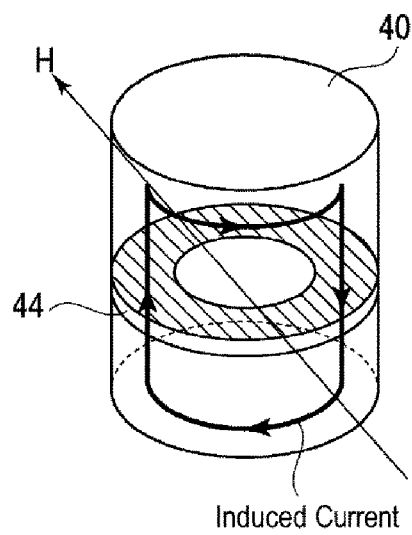
FIG. 8 is a view showing an example of an induced current flowing on the circular cylindrical spacer placed in a horizontal oscillating magnetic field and a longitudinal slit traversing the path of the induced current.

Even in this embodiment, if the spacer 40 itself generates heat by the electromagnetic induction heating and obtains a high temperature, then the connection with the heating element N may become a hot spot and the thermal uniformity of the heating element N may deteriorate in some cases. Thus, in order to prevent this, in some embodiments, the spacer 40 is selected to have a material or shape making it difficult to generate heat. Even though the horizontal oscillating magnetic field is generated as in this embodiment, if a spacer has a rectangular parallelepiped shape having a narrow transverse width of a surface opposite to the magnetic pole surface in order to make an area where a magnetic flux caused by the magnetic field is interlinked small, it is then possible to suppress the heat generation. Further, if the spacer 40 has a general circular cylindrical shape, as shown in FIG. 8, the horizontal oscillating magnetic field H causes the induced current to flow on the side surface of the circular cylinder in the shape of a loop. Thus, a transverse slit 44 running around the side surface of the cylinder is formed to traverse the path of the induced current and makes it difficult for the induced current to flow, which can suppress the heat generation of the spacer 40 itself.

Even in this embodiment, the plurality of heating elements N and the spacers 40 are assembled and combined into the form of blocks using no support jig to constitute the substrate holding element 24 in the same manner as the first embodiment. Thus, the occupying space of the support jig is unnecessary and thus the horizontal size of the processing vessel 22 can be reduced. Further, in case of the film forming process, there is a limitation in the reduction of the intervals between the heating elements N as described above. Therefore, the vertical size of the processing vessel 22 can be reduced by making the heating element N thin.

However, when the plurality of heating elements are disposed in the vertical direction within the horizontal oscillating magnetic field as described in this embodiment, if the heating element N made of a non-magnetic material such as a carbon-based material is made thin, an area where a magnetic flux caused by the horizontal oscillating magnetic field is interlinked is reduced. Therefore, an induced electromotive force induced to the heating element N is reduced and the heat generation amount is also reduced as much. In addition, the path in which the induced current flows is limited by making the heating element N thin. Thus, the heat generation amount is also reduced and the heating efficiency is remarkably deteriorated.

In order to solve the problem, in some embodiments, there is provided a heating element N having a configuration that a magnetic part made of a ferromagnetic material is installed at an appropriate position of a main body made of a non-magnetic material such as a carbon-based material. In such a magnetic part, the induced electromotive force induced by the oscillating magnetic field increases in proportion to the magnetic permeability of the ferromagnetic material. Therefore, it is possible to remarkably increase the heat generation amount caused by the induced current.

The magnetic part is made of an iron-based or cobalt-based ferromagnetic material, wherein in some embodiments, the iron-based magnetic material having a high magnetic permeability may be selected in terms of heating efficiency, and a cobalt-based magnetic material having a high Curie temperature may be selected in terms of heating temperature. The magnetic permeability is 100 to 200 when the iron-based magnetic material is placed in an oscillating magnetic field of 10 to 50 kHz. Thus, the induced electromotive force induced in the magnetic part is increased in proportion to the magnetic permeability. Also, the induced current becomes easy to flow on the surface of the magnetic part as the magnetic permeability is increased. Therefore, the induced current is not limited even though the magnetic part is made thin. For this reason, a sufficiently increased heating efficiency can be obtained even if the magnetic part made of the iron-based magnetic material is made thin up to 100 µm or so.

Figure 9:
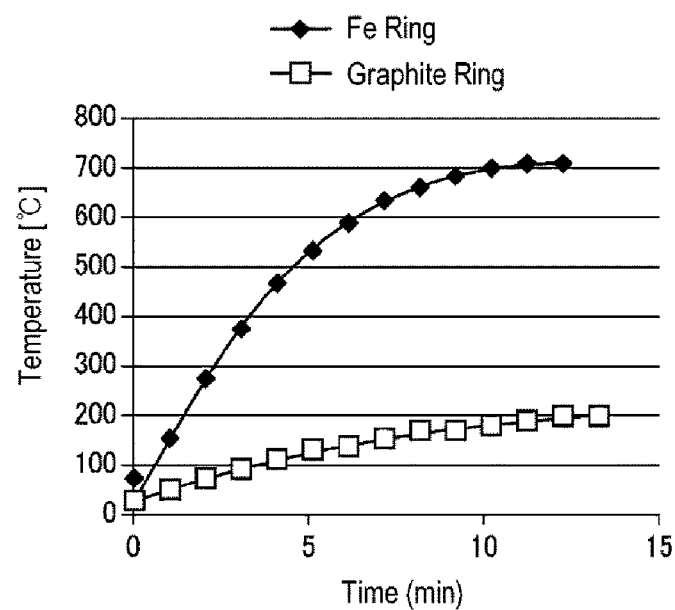
FIG. 9 is a diagram showing temperature rise curves when a graphite ring and a Fe ring made of common steel are heated through electromagnetic induction heating.

FIG. 9 is a diagram showing temperature rise curves in the case where a horizontal oscillating magnetic field is generated by applying a high frequency power of 50 kHz to the induction coil and a graphite ring and an Fe ring made of common steel are heated through the electromagnetic induction heating. In order to make thermal capacities of both rings nearly equal, the thickness of the graphite ring was set to 15 mm and the thickness of the Fe ring was set to 3 mm. It can be seen that even though the thickness of the Fe ring is one-fifth of that of the graphite ring, the Fe ring can be provided with an extremely high heating efficiency.

Figure 10:
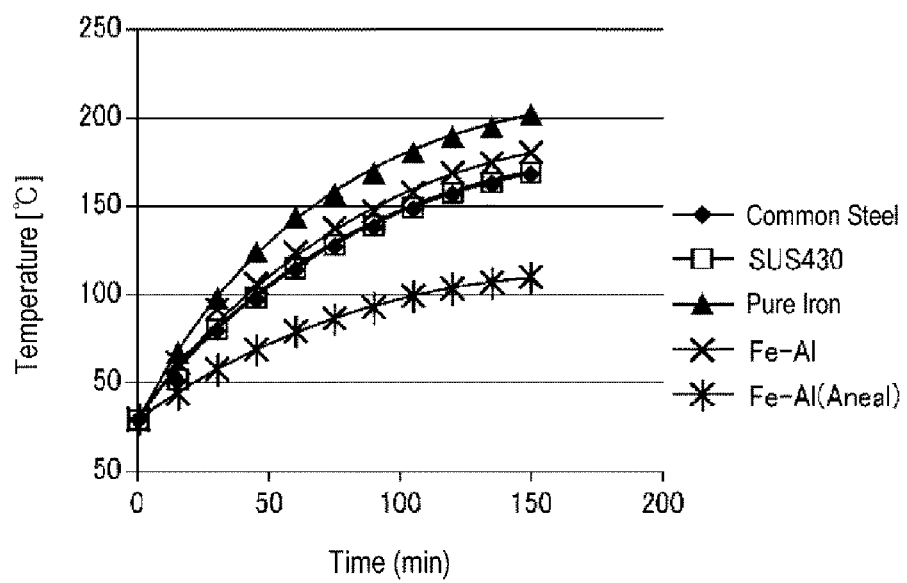
FIG. 10 is a diagram showing temperature rise curves when various kinds of iron-based magnetic materials in the shape of pellets are heated through electromagnetic induction heating.

In addition, FIG. 10 is a diagram showing temperature rise curves in the case where a horizontal oscillating magnetic field is generated by applying a high frequency power of 50 kHz to the induction coil and various kinds of iron-based magnetic materials in the shape of pellets are heated through the electromagnetic induction heating. In FIG. 10, it can be seen that the heating efficiency of pure iron is the highest. For this reason, in some embodiments, pure iron may be used as an iron-based magnetic material constituting the magnetic part of the heating element N. Further, the magnetic part may be formed of pure iron in the shape of a thin plate having a thickness of 100 µm or so.

Figure 11A:
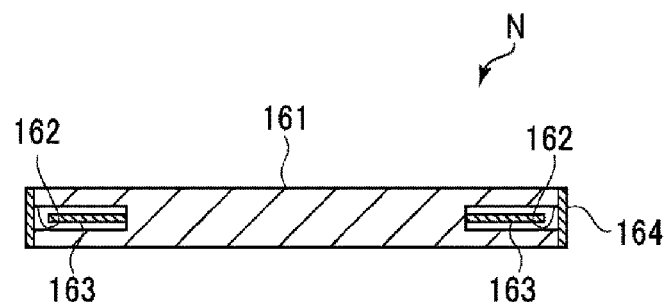
FIG. 11A is a cross sectional view showing a structural example of a heating element having a ferromagnetic material provided in a portion of a main body.
Figure 11B:
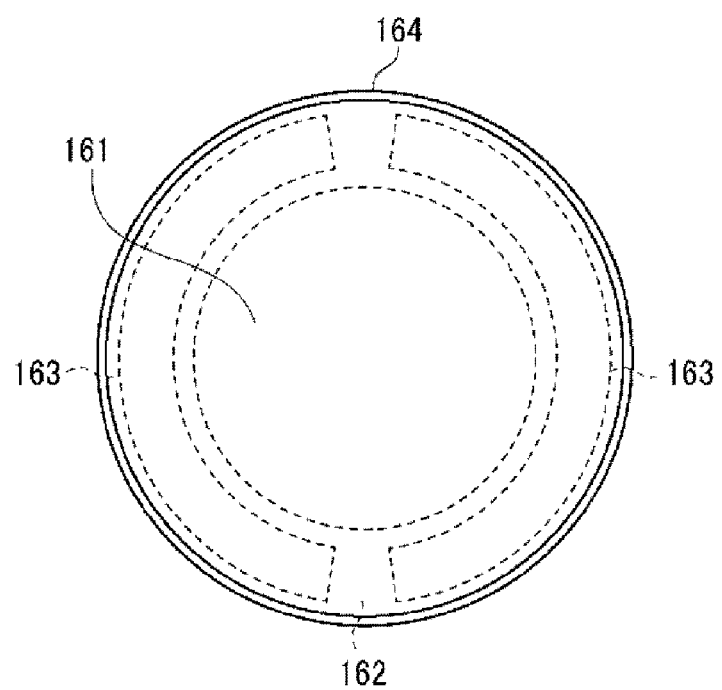
FIG. 11B is a plan view showing the structural example of the heating element having the ferromagnetic material provided in the portion of the main body.

However, in a state where the iron-based magnetic material is exposed from the heating elements, when the substrates are mounted on the heating elements and heated within the processing vessel 22 in a vacuum state, there is a concern that iron contamination of the substrates might occur. Therefore, it is necessary for the iron-based magnetic material not to be exposed to the heating elements. For this reason, in some embodiments, as shown in a cross sectional view of FIG. 11A and a plan view of FIG. 11B, grooves 162 are formed in a main body 161 as the heating element N and made of a non-magnetic material such as a carbon-based material, thin plates 163 of an iron-based magnetic material are respectively inserted into the grooves 162, and then, the grooves 162 are sealed with sealing members 164.

In such a case, the thin plates 163 of an iron-based magnetic material are prepared in a predetermined shape (circular arc shape in this example). Further, the grooves 162 of the main body 161 are formed in a shape to be matched with the thin plates 163 being inserted into the grooves 162. However, both the grooves 162 and the thin plates 163 are not brought into close contact with each other. Therefore, both of them are allowed to slide relative to each other, and it is possible to prevent stress deformation due to a difference in thermal expansion between the grooves 162 and the thin plates 163. Further, as the grooves 162 are sealed with the sealing members 164, iron contamination of the substrates from the thin plates 163 is prevented.

As a method of sealing the grooves 162, in some embodiments, a calcination carbonization method using an adhesive for a carbon material is employed. In this case, a sheet-shaped adhesive is formed by impregnating a base material made of carbon fibers or carbonaceous fillers with phenol resin as a thermosetting resin and making it a sheet shape. After the thin plates 163 are inserted into the grooves 162 of the main body 161, inlet portions of the grooves 162 are filled with the sheet-shaped adhesive in a semi-cured shape. Then, calcination is performed at 1000 degrees C. or more and also at a temperature lower than a melting point of the iron-based magnetic material (1500 degrees C. or so) to volatilize and carbonize impurities in the adhesive, thereby sealing the inlet portions of the grooves 162 (using the sealing members 164). Accordingly, the sealing through a highly pure carbon material is completed.

Further, in this embodiment, the material of the main body of the heating element is not necessarily a conductive material such as a carbon-based material. The main body of the heating element is made of a material having high thermal conductivity, such as aluminium nitride (AlN) and so on. In addition, the main body is provided with a magnetic part made of a ferromagnetic material. Therefore, the heat generated in the magnetic part is rapidly conducted to the entirety of the heating element, and so sufficient thermal uniformity can be obtained in the heating element. Even in this case, the sealing can be achieved by the above-described calcination carbonization method. However, a sealing method in which the inlet portions of the grooves 162 are filled with a ceramic-based inorganic adhesive and the adhesive is heated and cured may be used. Further, the sealing may be achieved by a glass welding method in which a glass material is heated up to a flow temperature and the glass material is welded to the inlet portions of the grooves 162.

Further, the present disclosure is not limited to the above-described embodiments but may be variously modified within the scope of the present disclosure. For example, while an example in which the substrates are mounted on the heating elements has been described in the embodiments, the substrates may be spaced apart from the heating elements. In addition, the film forming process has been described as an example of the heat treatment, outside of that, a process involving the heating of substrates, such as an oxidation process, annealing process, or diffusion process, may be included in the heat treatment of the present disclosure. Further, in the heat treatment of the present disclosure, the supply of gas is not necessary. Furthermore, while an example in which the induction coil or electromagnets as the electromagnetic induction source are installed outside the processing vessel has been described in the above embodiments, they may be installed inside the processing vessel. In addition, various substrates such as semiconductor substrates, sapphire substrates, ZnO substrates, and glass substrates may be used as the substrates according to the process and are not specifically limited.

In this way, according to a heat treatment apparatus of the present disclosure, a plurality of heating elements generate heat through electromagnetic induction heating to heat substrates through the heat transferred from the heating elements. Further, in the heat treatment apparatus, a substrate holding element is configured such that the heating elements are vertically disposed within the processing vessel with spacers interposed between the adjacent heating elements and the substrates are supported in a state where the substrates are mounted on the respective heating elements. For this reason, since the support jig for supporting the heating elements as used in the related art is unnecessary, the space that the support jig occupies within the processing vessel is omitted. Accordingly, the heating elements can be close to the induction coil, thereby making it possible to remarkably increase the heating efficiency. In addition, it is possible to minimize maintenance activities or costs for preventing the generation of dust within the processing vessel.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus configured to perform a heat treatment on a plurality of substrates, comprising:
a processing vessel configured to accommodate the plurality of substrates on which the heat treatment is performed;
an electromagnetic induction source configured to generate an oscillating magnetic field having a high frequency within the processing vessel; and
a substrate holding element having a plurality of heating elements arranged in a vertical direction and spacers interposed between the adjacent heating elements, the heating element being made of a conductive material and allowing an induced current caused by the oscillating magnetic field to flow therein to generate heat, the substrate holding element having a coil spring and supporting the spacers and the plurality of heating elements in a state where the substrates are mounted on the heating elements,
wherein the heating element includes a main body made of a non-magnetic material, and a magnetic part formed in the main body and made of a ferromagnetic material,
wherein the main body have a circular disk shape and is made of a carbon-based material, and the magnetic part is a thin plate inserted into the main body,
wherein the heating element is provided by forming a groove in the circular disk-shaped main body, inserting the thin plate into the groove, and then sealing the groove with a sealing member, and
wherein the sealing member is formed by filling an inlet portion of the groove with a sheet-shaped adhesive and then calcining and carbonizing the adhesive, the sheet-shaped adhesive being formed by impregnating a base material made of carbon fibers or carbonaceous fillers with phenol resin as a thermosetting resin.

2. The heat treatment apparatus of claim 1, wherein the processing vessel is made of an insulating material, the electromagnetic induction source has an induction coil wound around an outer periphery of the processing vessel, and a high frequency power is applied to the induction coil, thereby generating the oscillating magnetic field in a vertical direction within the processing vessel.

3. The heat treatment apparatus of claim 1, wherein the electromagnetic induction source includes electromagnets disposed outside the processing vessel, and a high frequency power is supplied to the electromagnets, thereby generating the oscillating magnetic field in a horizontal direction within the processing vessel.

4. The heat treatment apparatus of claim 3, wherein a plurality of electromagnetic induction sources are installed in the vertical direction along an arrangement direction of the heating elements.

5. The heat treatment apparatus of claim 1, wherein the heating element is made of a carbon-based material.

6. The heat treatment apparatus of claim 1, wherein the heating element is in the shape of a plate having a plane on which the substrate is mounted.

7. The heat treatment apparatus of claim 1, wherein the spacer is made of an insulating material.

8. The heat treatment apparatus of claim 1, wherein the spacer is made of the same material as the heating element and is shaped to minimize an area where a magnetic flux caused by the oscillating magnetic field is interlinked.

9. The heat treatment apparatus of claim 1, wherein the ferromagnetic material includes an iron-based magnetic material.

10. The heat treatment apparatus of claim 9, wherein the iron-based magnetic material includes pure iron.

\* \* \* \* \*